United States Patent
Chen

(10) Patent No.: US 6,524,965 B2
(45) Date of Patent: Feb. 25, 2003

(54) CLEANING METHOD FOR SEMICONDUCTOR MANUFACTURING PROCESS TO PREVENT METAL CORROSION

(75) Inventor: Chung-Tai Chen, Hsinchu Hsien (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/871,534

(22) Filed: May 31, 2001

(65) Prior Publication Data

US 2002/0166570 A1 Nov. 14, 2002

(30) Foreign Application Priority Data

May 11, 2001 (TW) ........................................ 90111230 A

(51) Int. Cl.[7] .............................................. H01L 23/48
(52) U.S. Cl. ........................................ 438/746; 438/768
(58) Field of Search ................................. 438/688, 658, 438/959, 768, 678, 692, 693, 746; 257/765, 752, 771; 204/196, 290; 134/1.3, 2, 1

(56) References Cited

U.S. PATENT DOCUMENTS

| | | | | |
|---|---|---|---|---|
| 3,868,313 A | * | 2/1975 | Gay ........................... 204/196 |
| 3,948,751 A | * | 4/1976 | Bianchi et al. ............. 204/290 |
| 4,351,696 A | * | 9/1982 | Radigan ..................... 438/768 |
| 4,855,023 A | * | 8/1989 | Clark et al. .................... 134/12 |
| 4,902,350 A | * | 2/1990 | Steck ............................ 134/1 |
| 5,318,676 A | * | 6/1994 | Sailor et al. ............. 204/129.3 |
| 5,427,622 A | * | 6/1995 | Stanasolovich et al. ........ 134/1 |
| 5,453,401 A | * | 9/1995 | Grivna et al. ............... 438/700 |
| 5,593,505 A | * | 1/1997 | Erk et al. .................... 134/1.3 |
| 5,783,489 A | * | 7/1998 | Kaufman et al. ........... 438/692 |
| 5,988,189 A | * | 11/1999 | Mohindra et al. ......... 134/95.2 |
| 6,165,279 A | * | 12/2000 | Tsao et al. ...................... 134/3 |
| 6,264,536 B1 | * | 7/2001 | Crevasse et al. .............. 451/41 |
| 6,273,099 B1 | * | 8/2001 | Chang et al. ................. 134/1.3 |
| 6,278,188 B1 | * | 8/2001 | McTeer ...................... 257/765 |
| 6,300,049 B2 | * | 10/2001 | Eichorst et al. ............. 430/529 |
| 6,323,128 B1 | * | 11/2001 | Sambucetti et al. ........ 438/678 |
| 6,339,026 B1 | * | 1/2002 | McTeer ...................... 438/688 |
| 6,427,705 B1 | * | 8/2002 | Chang et al. ............. 134/58 R |

* cited by examiner

*Primary Examiner*—Carl Whitehead, Jr.
*Assistant Examiner*—Laura M Schillinger
(74) *Attorney, Agent, or Firm*—J.C. Patents

(57) ABSTRACT

A cleaning method for semiconductor manufacturing process. A to-be-cleaned wafer having a metal layer thereon is provided. The wafer is placed into a chemical cleaning equipment unit to clean the wafer surface with a chemical cleaning solution while protecting the metal layer by a cathodic protection method. Next, the chemical cleaning solution on the wafer surface is rinsed away and the wafer is then dried to complete the cleaning method.

16 Claims, 2 Drawing Sheets

CLEANING METHOD FOR SEMICONDUCTOR MANUFACTURING PROCESS TO PREVENT METAL CORROSION

CROSS-REFERENCE TO RELATED APPLICATION

This application claims the priority benefit of Taiwan application serial no. 90111230, filed May 11, 2001.

BACKGROUND OF THE INVENTION

1. Field of the Invention

The present invention relates in general to a cleaning method for a semiconductor, and in particular, a cleaning method for a semiconductor manufacturing process to prevent metal corrosion by employing cathodic protection.

2. Description of the Related Art

In manufacturing technology of Very Large Scale Integration (VLSI), the most frequent step is wafer cleaning. 30% of all the manufacturing steps are dedicated to wafer cleaning, and therefore, the cleaning process of a wafer is important. The prime object of cleaning silicon wafer is to remove metal impurities and organic compound contaminants on the surface of the silicon wafer and to reduce adsorption of micro-particles. Excessive metal impurities will cause a current leakage at p-n joining surface, decrease life cycle for a minor carrier and lower breakdown voltage of an AND gate oxidation layer. In another aspect, the adsorption of the micro-particles will affect precision of image transfer in a micro-imaging process, and may further cause a short circuit in circuit structure.

The process of wafer cleaning is divided into two stages. The first stage is known as a front end of line (FEOL) cleaning, for instance, a pre-cleaning of the dispersion and epitaxial fabrication process, removal of an oxide layer and a silicon oxide layer and etching and removal of a polycrystalline silicon. The next stage is the back end of line (BEOL) cleaning, for instance, cleaning of dielectric layer between metals, cleaning following etching of a metal layer, cleaning before and after the removal of photo-resist, cleaning after CMP and reclamation of a wafer.

There are three important objectives in the current cleaning process, namely, lowering metal impurities of the wafer, lowering organic compound contaminants and reducing the number of micro-particles. Following the rapid development of sub-micron manufacturing technology, cleaning is increasingly critical with respect to micro-particles and metal impurities, and in particular with respect to the requirement for metal impurities.

In the current cleaning method for a wafer surface, the most common type of cleaning method is RCA cleaning technology. In this RCA cleaning technology, an weak acid or weak alkaline solution is used as a cleaning solution. The wafer is immersed in the cleaning solution having a pH value, and contaminants on the wafer surface are removed by appropriate stress. However, in the cleaning process of the back end metal manufacturing process of a semiconductor the metal atoms of a wire connection metal surface exposed by the wafer surface produces a chemical or an electrochemical reaction with acidic ion or alkali ions in the cleaning solution to form metal ions. Metal corrosion is formed on the wafer surface, which lowers product yield and increases production cost.

SUMMARY OF THE INVENTION

Accordingly, it is an object of the present invention to provide a cleaning method for a back end manufacturing of a semiconductor by employing cathodic protection to prevent metal corrosion on the wafer surface, and by means of a sacrificial anode to provide charges required by the metal layer of the wafer surface so that metal atoms on the wafer surface are not attacked by acidic ions or alkaline ions (for example $H^-$ and $OH^-$). As a result of the present invention, the product yield is effectively improved and the production cost is reduced.

Another object of the present invention is to provide a cleaning method for a semiconductor manufacturing process to prevent metal corrosion. The method begins by providing a to-be-cleaned wafer having a metal layer thereon. The wafer is placed into a chemical cleaning equipment unit to clean the wafer surface with a chemical cleaning solution while the metal layer is protected with a cathodic protection. Then, the chemical cleaning solution is removed from the wafer by rinsing before drying the wafer.

Yet another object of the present invention is to provide a cleaning method employing a chemical cleaning solution to clean a wafer, whereby an externally applied current provides charges required for prevention of oxidation on the metal layer on the wafer surface so as to avoid metal corrosion on the wafer surface and to improve product yield and lower the production cost.

It is to be understood that both the foregoing general description and the following detailed description are exemplary, and are intended to provide further explanation of the invention as claimed.

DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
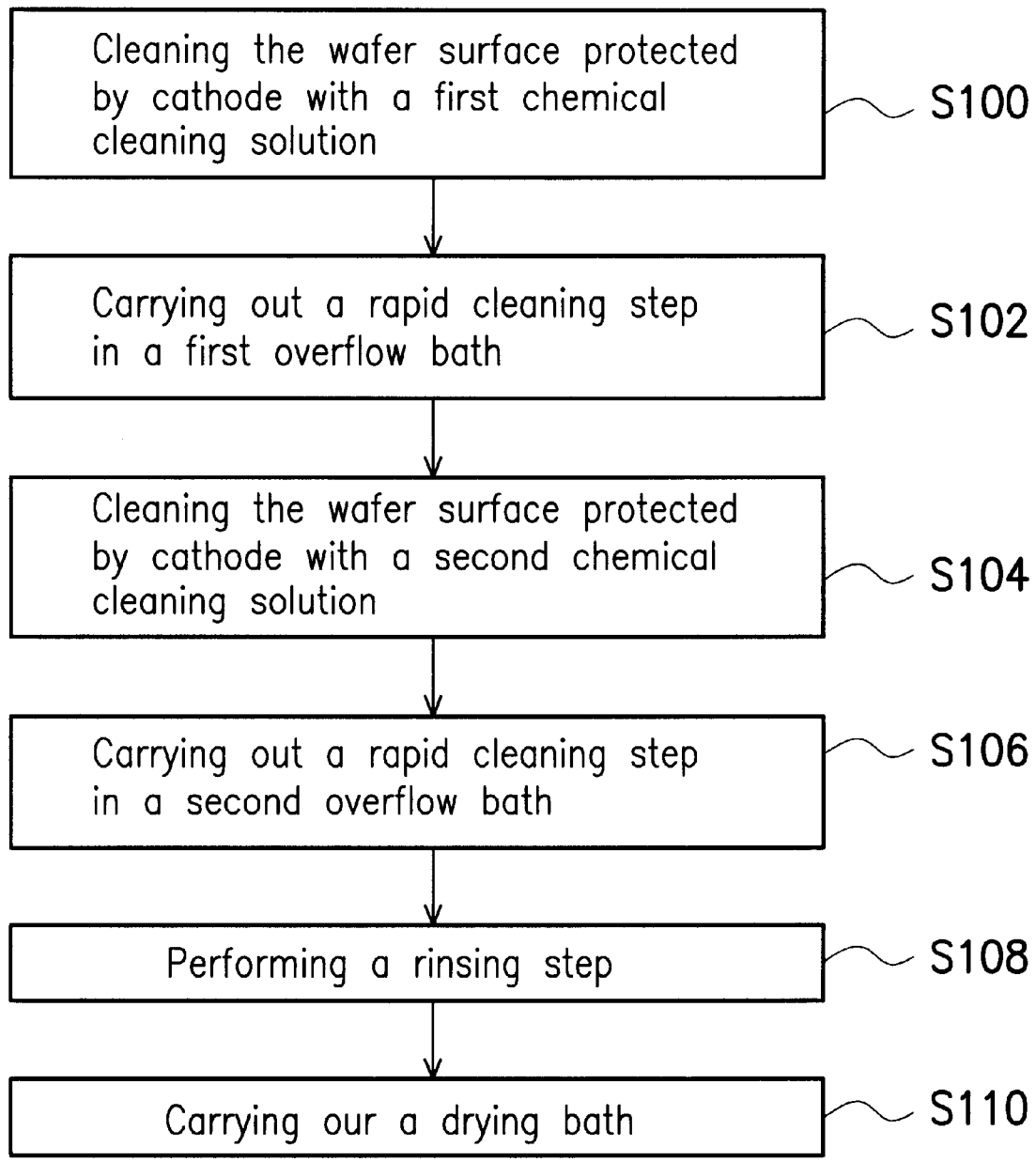
FIG. 1 is a flowchart of a cleaning method for a semiconductor manufacturing process to prevent metal corrosion in accordance with a preferred embodiment of the present invention.

The preferred embodiment of the present invention will be described with reference to the accompanying drawings. Like or corresponding members are designated by like reference characters or corresponding reference characters.

FIG. 1 is a flowchart of a cleaning method in a semiconductor manufacturing process to prevent metal corrosion in accordance with a preferred embodiment of the present invention. Referring to FIG. 1, the steps of the cleaning of the wafer are as follows:

First, step S100 is carried out. After formation of metal in the back end of semiconductor manufacturing process, for instance, after the completion of the manufacturing process of aluminum metal (or copper), a wafer having a surface thereof adsorbed with a contaminant is placed into a first chemical cleaning bath. The wafer surface is cleaned with a first chemical cleaning solution so as to remove major organic contaminants, micro-particles, and metal impurities adsorbed into the wafer surface. The metal layer on the wafer surface is protected by cathodic protection. The first chemical cleaning solution is, for example, SC1 solution ($NH_4OH/H_2O_2/H_2O$=1:5, ammonium hydroxide/hydrogen peroxide mixture, abbreviated as ADM). The organic contaminants on the wafer surface are removed by $NH_4OH$ electrolysis and strong $H_2O_2$ oxidation, a portion of the metal contaminants is removed due to complex formation by $NH_4OH$ and partially contaminated metal ions.

The SC1 cleaning solution is transported to a SC1 chemical cleaning bath via a conduit to clean the wafer. The method of cleaning includes spraying SC1 cleaning solution onto the wafer surface and then scrubbing with a brush. Alternatively, the wafer is dipped into the SC1 cleaning solution and then cleaned with an ultrasonic oscillator. Cleaning temperature ranges from about 75° C. to 85° C. and the cleaning time is about 5 mm.

Next, referring to FIG. 1, a rapid cleaning step S102 is carried out. The wafer after being treated in step S100 is placed into a first overflow bath and a rapid cleaning method is employed to remove the first chemical cleaning solution remained on the wafer surface so that the wafer is cleaned. The employed cleaning solution is, for instance, deionized water.

Next, a second chemical cleaning step S104 is carried out. The wafer treated in step S102 is now placed into a second chemical cleaning bath and the wafer surface is cleaned with a second chemical cleaning solution so as to remove minute amounts of metal contaminants and hydroxide adsorbed in the wafer surface, both of which cannot be removed with the first chemical cleaning solution. In this step, the metal layer on the wafer surface is protected by cathodic protection. The second chemical cleaning solution is, for example, SC2 solution ($HCl/H_2O_2/H_2O$ =1:1:6, hydrochloric acid/hydrogen peroxide mixture, abbreviated as HPM). The low pH value range and solubility in an aqueous oxygen of SC2 cause the metal contaminants to be removed by way of solubility in an ionic state. In addition, the structure of the second chemical cleaning bath is, for example, similar to that of the first chemical cleaning bath.

Additionally, the SC2 cleaning solution is transported to an SC2 chemical cleaning bath via a conduit to clean the wafer. The method of cleaning includes spraying SC2 cleaning solution the wafer surface and then scrubbing with a brush. Alternatively, the wafer is dipped into the SC2 cleaning solution and the cleaned. The cleaning temperature ranges from about 75° C. to 85° C. and the cleaning time is about 5 min.

Next, referring to FIG. 1, a rapid cleaning step S106 is carried out. The wafer treated in step S104 is now placed into a second overflow bath, and a rapid cleaning method is employed to remove the chemical cleaning solution remaining on the wafer so that the wafer is clean. The employed cleaning solution is, for instance, deionized water.

Next, a rinsing step S108 is carried out. The wafer is placed into a final rinse (FR) bath and cleaned with an ultrasonic oscillator such that the wafer is further cleaned.

Next, in step 110, the wafer is placed into a drying bath to be dried. The drying bath is, for example, an isopropyl alcohol (EPA) drying bath, in which the water content of the wafer is removed by isopropyl alcohol vapor to attain the objective of drying.

Figure 2:
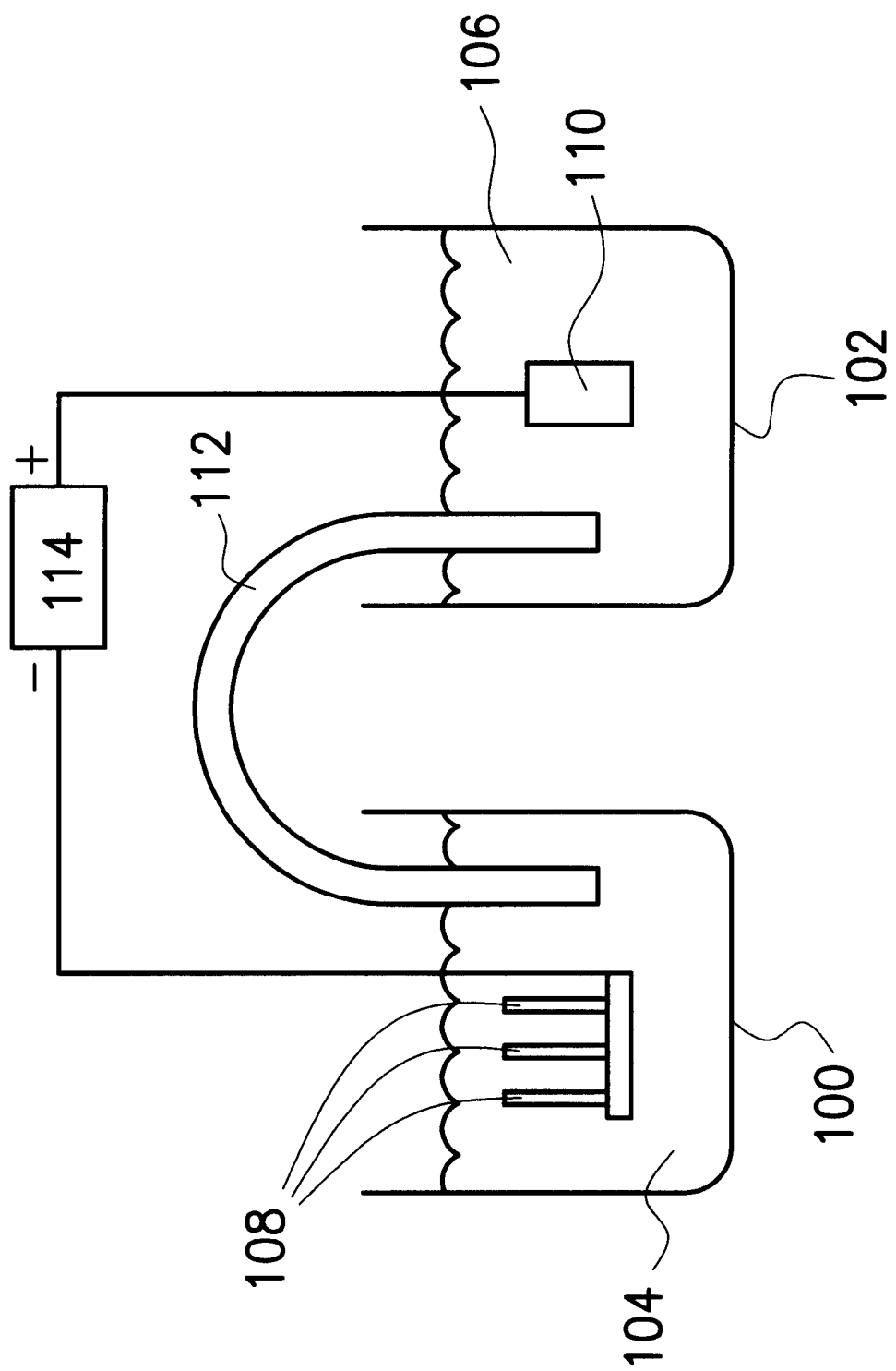
FIG. 2 is a schematic view of a chemical cleaning equipment unit for metal corrosion protection in accordance with the preferred embodiment of the present invention.

FIG. 2 schematically shows a preferred embodiment of a cleaning method for a semiconductor manufacturing process to prevent metal corrosion. In accordance with the present invention, the chemical cleaning equipment comprises a chemical cleaning bath 100 containing a chemical cleaning solution 104 and an isolation bath 102. A salt bridge 112 connects the chemical cleaning bath 100 and the isolation bath 102. The isolation bath 102 contains an electrolyte solution 106 and the salt bridge 112 contains an electrolyte solution to be used as an electrical conduction.

Further, the chemical cleaning equipment employs a power source supply device 114 to provide a power source for cathodic protection. The cathode of the power source supply device 114 is electrically connected to the wafer 108 and the anode is electrically connected to the sacrificial anode 110 located in the isolation bath 102. The sacrificial anode 110 comprises iron, copper, aluminum, graphite, or other material having similar properties.

In the present chemical cleaning equipment, the voltage and current supplied by the power source supply device 114 must be adjusted in accordance with actual demand in order to sufficiently supply potential and charges to the wafer 108 so as to attain sufficient cathodic protection. The method is explained as follows:

When the metal layer on the wafer surface is aluminum and the sacrificial anode is iron, a comparison of the oxidation potential between aluminium and iron, reveals that the oxidation potential of the aluminum is higher than that of the iron. Thus, at this instance, a fixed voltage has to be added to the power source supply device 114 so as to overcome the difference in oxidation potential between the aluminum and iron so that the sacrificial anode produces an oxidation reaction and provides charges to the aluminum metal to prevent an oxidation reaction. Accordingly, the objective of protection of the aluminum metal on the wafer surface is attained.

Furthermore, in accordance with the present invention, the sacrificial anode 110 is positioned in the isolation bath, and electrically conducts with the wafer 108 via a salt bridge 112. This method avoids oxidation of the sacrificial anode 110, by which the formed metallic ions would again contaminate the wafer 108 surface.

The cleaning method for a semiconductor wafer in accordance with the present invention has the following advantages: In the course of wafer cleaning with a chemical cleaning solution, current from an external source provides charges needed to prevent oxidation of metal layer on the wafer surface so as to avoid corroding the metal layer of the wafer surface. In turn, the product yield is improved and the production cost is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cleaning method for a semiconductor manufacturing process to prevent metal corrosion, comprising:

providing a wafer having a metal layer thereon, wherein the wafer is to be cleaned;

placing the wafer into a first chemical cleaning equipment unit to clean a wafer surface with a first chemical cleaning solution while protecting the metal layer by cathodic protection wherein the wafer is immersed in a first chemical cleaning bath containing the first chemical cleaning solution which is electrically connected through a salt bridge to an isolation bath containing an electrolyte solution in which is immersed a sacrificial anode, the sacrificial anode in the isolation bath and the wafer in the first chemical cleaning bath being further electrically connected to a power source supply; and rinsing away the first chemical cleaning solution on the wafer; and drying the wafer.

2. The cleaning method of claim 2, wherein the sacrificial anode comprises iron, copper, aluminum or graphite.

3. The cleaning method of claim 1, wherein the first chemical cleaning solution includes SC1 cleaning solution comprising $NH_4OH/H_2O_2/H_2O=1:1:5$.

4. The cleaning method of claim 1, wherein prior to drying the wafer, farther comprises:

placing the wafer into a second chemical cleaning equipment unit, and using a second chemical cleaning solution to clean the wafer to remove at least one contaminant which cannot be removed with the first chemical cleaning solution, wherein the metal layer is protected by cathodic protection; and rinsing away the second chemical cleaning solution on the wafer.

5. The cleaning method of claim 4, wherein the second chemical cleaning equipment unit providing cathodic protection comprises:

a chemical cleaning bath containing the second chemical cleaning solution, wherein the wafer is located within the second chemical cleaning solution;

an isolation bath containing an electrolyte solution, wherein the isolation bath is connected to the chemical cleaning bath by a salt bridge;

a sacrificial anode positioned in the electrolyte solution; and a power source supply device electrically connected to the sacrificial anode and the wafer, wherein voltage supplied by the power source supply device is sufficient to cause oxidation on the sacrificial anode and to provide electrons to the wafer to produce a cathodic protection effect.

6. The cleaning method of claim 5, wherein the sacrificial anode comprises iron, copper, aluminum or graphite.

7. The cleaning method of claim 5, wherein the second chemical cleaning solution includes SC2 cleaning solution comprising $NH_4OH/H_2O_2/H_2O=1:1:6$.

8. The cleaning method of claim 1, wherein prior to drying the wafer, further comprises placing the wafer into a water bath to clean the wafer with deionized water.

9. A cleaning method for semiconductor manufacturing process to prevent metal corrosion comprising:

providing a to-be-cleaned wafer having a metal layer thereon;

placing the wafer into a first chemical cleaning equipment to clean the wafer surface with a first chemical cleaning solution while protecting the metal layer by cathodic protection, wherein the wafer is electrically connected through a salt bridge to an isolation bath;

rinsing away the first chemical cleaning solution on the wafer;

placing the wafer into a second chemical cleaning equipment to clean the wafer surface with a second chemical cleaning solution to remove at least one contaminant which cannot be removed by the first chemical cleaning solution while protecting the metal layer by cathodic protection;

rinsing away the second chemical solution on the wafer; and drying the wafer.

10. The cleaning method of claim 9, wherein prior to drying the wafer, further comprises placing the wafer into a water bath to clean the wafer with deionized water.

11. The cleaning method of claim 9, wherein the first chemical cleaning equipment providing cathodic protection comprises:

a chemical cleaning bath containing a first chemical cleaning solution, wherein the wafer is located within the first chemical cleaning solution;

an isolation bath containing an electrolyte solution, wherein the isolation bath is connected to the chemical cleaning bath by a salt bridge;

a sacrificial anode positioned in the electrolyte solution; and a power source supply device electrically connected with the sacrificial anode and the wafer, wherein the voltage supplied by the power source supply device is sufficient to cause oxidation on the sacrificial anode and to provide electrons to the wafer to produce a cathodic protection effect.

12. The cleaning method of claim 11, wherein the sacrificial anode comprises iron, copper, aluminum or graphite.

13. The cleaning method of claim 9, wherein the first chemical cleaning solution includes SC1 cleaning solution comprising $NH_4OH/H_2O_2/H_2O=1:1:5$.

14. The cleaning method of claim 9, wherein the second chemical cleaning equipment providing cathodic protection comprises:

a chemical cleaning bath containing a second chemical cleaning solution, wherein the wafer is located in the second chemical cleaning solution;

an isolation bath containing an electrolyte solution, wherein and the isolation bath is connected to the chemical cleaning bath by a salt bridge;

a sacrificial anode positioned in the electrolyte solution; and a power source supply device electrically connected with the sacrificial anode and the wafer, wherein the voltage supplied by the power source supply device is sufficient to cause oxidation on the sacrificial anode and to provide electrons to the wafer to produce a cathodic protection effect.

15. The cleaning method of claim 14, wherein the sacrificial anode comprises iron, copper, aluminum or graphite.

16. The cleaning method of claim 9, wherein the first chemical cleaning solution includes SC2 cleaning solution comprising $NH_4OH/H_2O_2/H_2O=1:1:6$.

* * * * *